US009117935B2

(12) United States Patent
Chu

(10) Patent No.: US 9,117,935 B2
(45) Date of Patent: Aug. 25, 2015

(54) CURRENT APERTURE DIODE AND METHOD OF FABRICATING SAME

(75) Inventor: Rongming Chu, Newbury Park, CA (US)

(73) Assignee: HRL Laboratories, LLC, Malibu, CA (US)

(*) Notice: Subject to any disclaimer, the term of this patent is extended or adjusted under 35 U.S.C. 154(b) by 258 days.

(21) Appl. No.: 13/530,481

(22) Filed: Jun. 22, 2012

(65) Prior Publication Data
US 2013/0341632 A1 Dec. 26, 2013

(51) Int. Cl.
H01L 29/872 (2006.01)
H01L 29/417 (2006.01)
H01L 29/66 (2006.01)
H01L 29/205 (2006.01)
H01L 29/20 (2006.01)

(52) U.S. Cl.
CPC ............ H01L 29/872 (2013.01); H01L 29/205 (2013.01); H01L 29/417 (2013.01); H01L 29/66212 (2013.01); H01L 29/2003 (2013.01)

(58) Field of Classification Search
CPC . H01L 29/205; H01L 29/872; H01L 29/8725; H01L 29/417; H01L 29/66143; H01L 29/66212
USPC .......................................... 257/183, 471, 472
See application file for complete search history.

(56) References Cited

U.S. PATENT DOCUMENTS

| 6,884,291 | B1* | 4/2005 | Jikutani et al. ................... 117/89 |
| 2006/0068537 | A1 | 3/2006 | Hayashi | |
| 2007/0218596 | A1 | 9/2007 | Hayashi | |
| 2007/0252171 | A1 | 11/2007 | Yamagami | |
| 2010/0140660 | A1* | 6/2010 | Wu et al. ........................ 257/183 |
| 2010/0207166 | A1* | 8/2010 | Zhu ................. 257/201 |
| 2012/0280281 | A1* | 11/2012 | Bahl ............................. 257/201 |
| 2013/0119394 | A1* | 5/2013 | Zhu et al. ........................ 257/76 |

FOREIGN PATENT DOCUMENTS

| JP | 06-013602 A | 1/1994 |
| JP | 4211480 B2 | 1/2009 |

OTHER PUBLICATIONS

PCT International Search Report mailed on Sep. 25, 2013 from corresponding PCT Application No. PCT/US2013/046662.
(Continued)

Primary Examiner — Yu Chen
(74) Attorney, Agent, or Firm — Ladas & Parry

(57) ABSTRACT

A diode and a method of making same has a cathode an anode and one or more semiconductor layers disposed between the cathode and the anode. A dielectric layer is disposed between at least one of the one or more semiconductor layers and at least one of the cathode or anode, the dielectric layer having one or more openings or trenches formed therein through which the at least one of said cathode or anode projects into the at least one of the one or more semiconductor layers, wherein a ratio of a total surface area of the one or more openings or trenches formed in the dielectric layer at the at least one of the one or more semiconductor layers to a total surface area of the dielectric layer at the at least one of the one or more semiconductor layers is no greater than 0.25.

29 Claims, 3 Drawing Sheets

(56) References Cited

OTHER PUBLICATIONS

PCT International Search Report with Written Opinion mailed on Sep. 25, 2013 from corresponding PCT Application No. PCT/US2013/046662.

PCT International Preliminary Report on Patentability Chapter I (with Written Opinion) from PCT/US2013/046662 mailed on Dec. 31, 2014.

* cited by examiner

Prior Art
Schottky Diode

Nano-Aperature
Schottky Diode

CURRENT APERTURE DIODE AND METHOD OF FABRICATING SAME

CROSS REFERENCE TO RELATED APPLICATIONS

None.

TECHNICAL FIELD

This invention is related to semiconductor diodes and methods of making same.

BACKGROUND

Schottky diodes using wide bandgap semiconductor materials have the advantage of a high breakdown voltage, a low on-resistance, and a low switching loss compared with conventional Si-based PN or PIN diodes. FIG. 1 depicts a prior art Schottky diode with an anode and a cathode separated by layers of n+ SiC and n− SiC. In accordance with the principles of this invention, we propose a new diode design using GaN-based semiconductor materials. The new design exhibits a performance improvement over the prior art SiC diode in terms of a reduced on-state resistance ($R_{on}$), a lower leakage current, a reduced forward voltage drop, reduced sensitivities to material defects, and lower fabrication costs due to the materials utilized, etc.

BRIEF DESCRIPTION OF THE INVENTION

In one aspect the present invention provides a diode having: a cathode; an anode; a plurality of semiconductor layers disposed between said cathode and the anode, said plurality of semiconductor layers forming a heterointerface between two of said plurality of semiconductor layers, and wherein said two semiconductor layers are formed of different materials, one material of said two semiconductor layers having a higher bandgap than a material of the other of said two semiconductor layers, with the semiconductor layer formed of the higher bandgap material being disposed closer to said anode than the semiconductor layer formed of said other material; and a dielectric layer disposed between the semiconductor layer having the higher bandgap material and said anode, the dielectric layer having one or more openings or trenches formed therein via which said anode projects into said at least said semiconductor layer having the higher bandgap material.

In another aspect the present invention provides a method of making a diode comprising the steps of forming two semiconductor layers on a substrate, the two semiconductor layers being formed of different materials, a first material of said two semiconductor layers having a relatively lower bandgap and a second material of said two semiconductor layers having a relatively higher bandgap, the semiconductor layer of said first material being formed directly on said substrate and the semiconductor layer of said second material being formed directly on the semiconductor layer of said first material; forming a dielectric layer on the semiconductor layer of said second material; forming one or more openings or trenches penetrating the dielectric material; forming an anode on said dielectric layer and in said one or more openings or trenches so that material of the anode at least contacts the semiconductor layer of said second material; and forming a cathode in contact with said substrate.

In yet another aspect the present invention provides a method of reducing a forward biased voltage drop in a diode comprising the step of: adding a layer of a dielectric material between a heterojunction formed by two semiconductor materials disposed between an anode and a cathode of said diode, the heterojunction forming a two-dimensional electron gas conduction channel; and forming at least one tench or opening in said layer of dielectric material so that said anode contacts the two-dimensional electron gas conduction channel of said heterojunction only via said at least one tench or opening in said layer of dielectric material, the at least one tench or opening in said layer of dielectric material having a total opening size which is less than a remaining surface area of layer of dielectric material after the said at least one tench or opening is formed therein.

DETAILED DESCRIPTION

Figure 2:
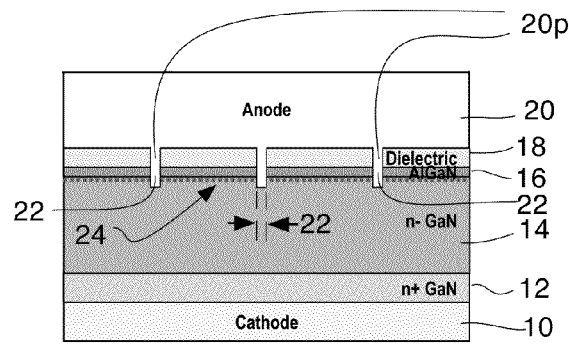
FIG. 2 depicts a side elevational view of an embodiment of a Schottky diode in accordance with the principles of the present invention.
Figure 3:
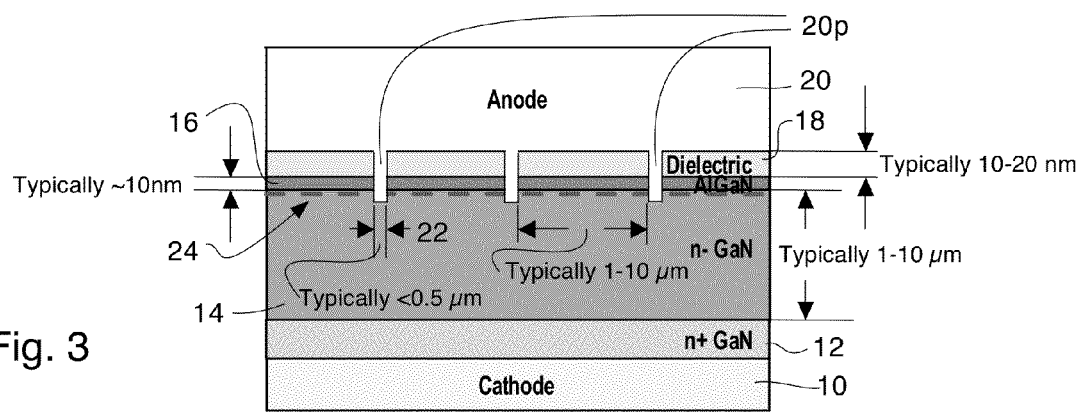
FIG. 3 is a side elevational view similar to that of FIG. 2, but dimensions have been added to this figure to show, in greater detail, one possible embodiment of a Schottky diode in accordance with the principles of the present invention.

FIG. 2 depicts, in a side elevational view, one possible embodiment of the improved Schottky diode in accordance with the principles of the present invention. FIG. 3 is a side elevational view very similar to that of FIG. 2, but with the addition of dimensions of certain layers and openings being specified. These dimension are provided to show one possible embodiment corresponding to the embodiment of FIG. 2, which itself is one possible embodiment of the improved Schottky diode in accordance with the principles of the present invention.

The side elevational views of FIGS. 2 and 3 show only a portion of the side elevation of a complete diode—the depicted openings 22 will typically repeat many times across a diode and only a few openings 22 are shown for ease of illustration.

Figure 1:
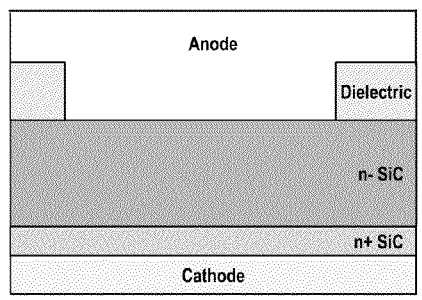
FIG. 1 depicts a side elevational view of a prior art Schottky diode.
Figure 3A:
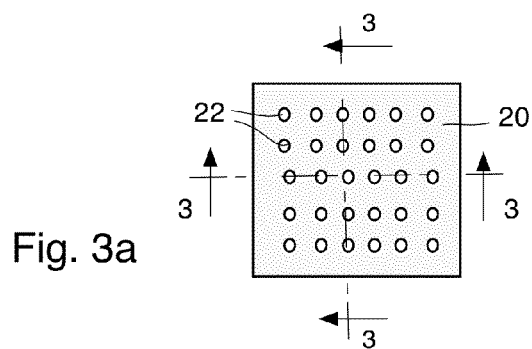
FIG. 3a is a top view with section lines 3-3 showing where the side elevational view of FIG. 3 occurs (in two places at right angles to each other), showing one possible embodiment of the shapes of the anode projections.

In FIG. 2 the improved Schottky diode has a cathode 10, which may be of conventional design, and an anode 20 separated by semiconductor layers 12, 14 and 16. That which is un-conventional and thus new is that (i) a heterointerface is formed between two semiconductor materials, which materials might be, for example, AlGaN in layer 16 and GaN in layer 14, forming a potential well which confines electrons and defines a two-dimensional electron gas (2DEG) conduction channel 24—so a heterointerface is preferably formed by layer 16, preferably of AlGaN, which is in contact with layer 14, preferably of GaN, but layer 16 is preferably separated from most of the anode 20 by a dielectric layer 18, and (ii) one or more openings (or one or more current apertures) 22 are formed in the dielectric layer 18 and in layer 16 so that the anode 20 makes direct contact with layer 14 preferably only by one or more projections 20p which extend from a main portion of anode 20 through the openings 22 to make contact with layer 14 through the heterointerface formed by layers 14 and 16. Material-wise, the anode 20 may be similar to anode of the prior art device of FIG. 1. But the addition of projections 20p which extend from the main portion of anode 20 through the openings 22 make the anode of FIGS. 2 and 3 considerably different configuration-wise compared to the prior art anode of FIG. 1. The one or more openings 22 can be of any convenient shape when viewed in a plan view (such as square, hexagonal or circular or any other convenient geometric shape). The total area of the main portion of anode 20 (when viewed in a plan view such as that of FIG. 3a) is much larger that the total area of the one or more projections 20p (again, when viewed in plan view). The one or more projections are preferably formed of the same material and are preferably formed when the rest of the anode 20 is formed. The projections 20p preferably extend into layer 14 by a distance in the range of 5-500 nm and more preferably by a distance of about 10 nm in depth to help ensure a good contact between anode metal and the AlGaN/GaN interface at the 2DEG conduction channel 24. The depths that the projections 20p preferably extend into layer 14 are accentuated in FIGS. 2 and 3 for ease of illustration.

In the embodiment of FIG. 3, the each opening 22 through layers 16 and 18 preferably has a maximum size along at least one lateral dimension of less than 0.5 µm and the one or more openings 22 are preferably laterally spaced from one another (along possibly another lateral dimension) by a distance preferably in the range of 1 to 10 µm. The ratio of the surface areas of the projections 20p of the anode 20 in contact with layer 14 (when viewed in plan view) compared to the area of main body portion of the anode 20 (again when viewed in plan view) can fall in the range of 0.25 to 0.0025 or even possibly less. Since the dielectric layer 18 preferably has the same extent (in plan view) as the anode 20, this ratio also holds for the ratio of the surface areas of the projections 20p of the anode 20 in contact with layer 14 (when viewed in plan view) compared to the area of dielectric layer 18 (again when viewed in plan view).

In the embodiment of FIG. 3, a plurality of openings 22 are depicted. However as will be seen, embodiments may be formed with a single opening 22 or multiple openings 22 preferably defining some geometric shape or shapes which have a trench width preferably less than 0.5 µm.

In the embodiment of FIG. 3, the thickness of layer 14 preferably falls in the range of 1-5 µm, the thickness of layer 16 is preferably equal to or about 10 nm, and the thickness of layer 18 preferably falls in the range of 10-20 nm.

Layer 16 can be formed of either AlGaN or AlInN, or any other suitable material, so long as the material selected for layer 16 has a bandgap greater than the material selected for layer 14 (which is preferably GaN) and able to form a heterojunction with the material selected for layer 14.

Figure 4A:
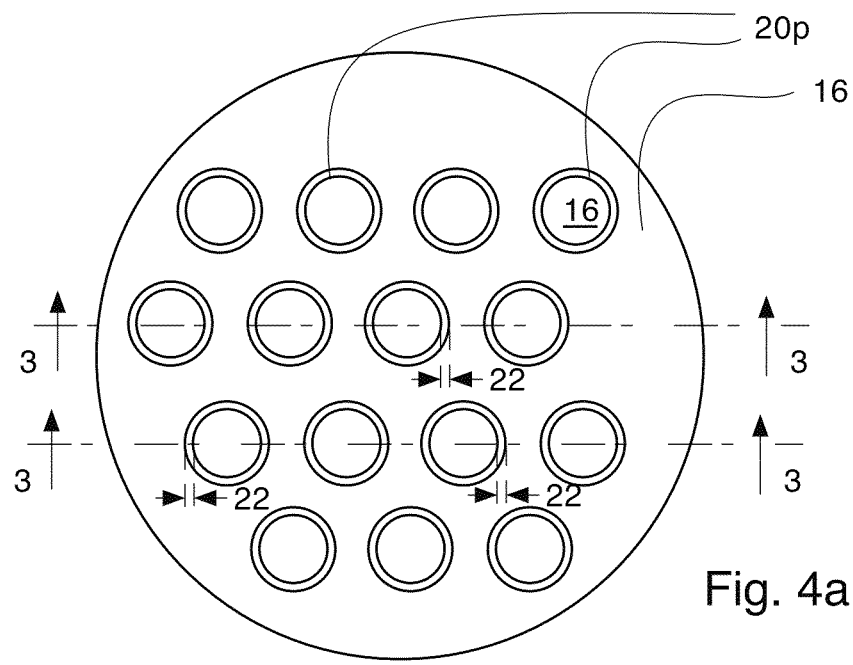
FIGS. 4a and 4b depict other possible embodiments for the shapes of the anode projection(s).
Figure 4B:
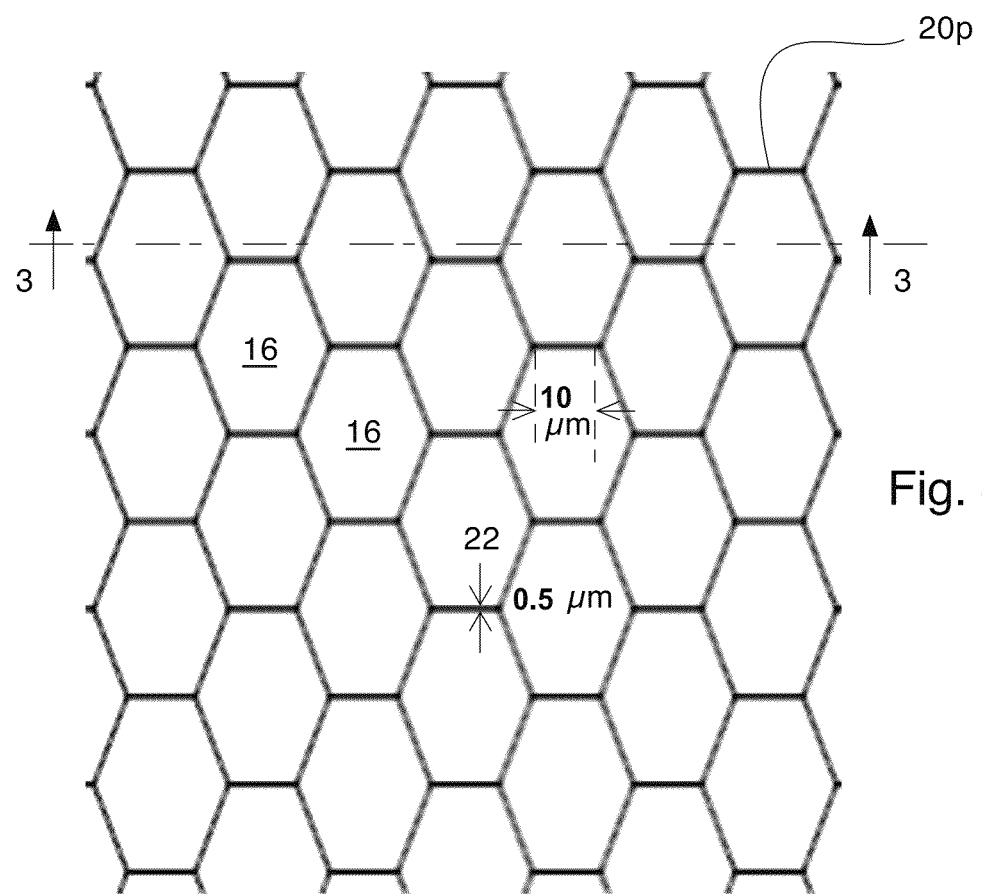

FIG. 4a depicts the projections 20p in a sectional plan view as they emerge from the dielectric layer 18. In this embodiment the projections 20p are defined by the sidewalls of a plurality of annularly shaped projections (as opposed to the solid, circularly shaped projections depicted by FIG. 3a). The sidewalls 20p penetrate into layer 16. The cross section of FIG. 3 is still basically correct for this embodiment, so it is marked in two places—but it should be observed that the are more sidewalls projections 20p in FIG. 4a than in FIG. 3. The sidewall projections 20p of the annularly shaped projections are disposed in openings or trenches 22 formed in layers 16 and preferably also formed in layer 18, the sidewall projections 20p having a maximum width dimension preferably <0.5 µm. The distance between the sidewalls 20p of neighboring annularly shaped projections is preferably in the range of 0-10 µm while the diameters of the annularly shaped projections is preferably in the range of 1-10 µm. If the distance between the sidewalls of neighboring annularly shaped projections 20p is made equal to zero, then the annularly shaped projections are arranged so that they contact each other and the projections 20p then merge into a unitary projection. Similarly, the openings 22 merge to become a single opening or trench 22 which defines the shape of the unitary projection 20p. FIG. 4b shows a unitary projection 20p which takes a honeycomb or hexagonal shape or configuration.

The discussion above uses the term "diameter" with respect to annularly shaped projections of FIG. 4a, but those projections 20p can be of any convenient shape or configuration and do not need to be circularly-shaped. For example, in FIG. 4b a projection 20p in plan view which is formed in a honeycomb or hexagonal pattern (with the hexagons touching—they could also be spaced apart much like the annularly shaped projections of FIG. 4a). So in the embodiment of FIG. 4b, the projection 20p is a unitary projection which follows a repeating regular geometric pattern and, in this embodiment, that repeating geometric pattern is that of a six sided polygon or hexagon (whose sides do not need to be of equal length). Of course, other repeating geometric patterns may be used, if desired. The embodiment of FIG. 4b is presently preferred.

The projection or projections 20p do not need to assume some particular geometric shape when viewed in plan view. The shape of the projection 20p or the shapes of the projections 20p may be arbitrary or even random, if desired. But it is anticipated that diode will be easier to design if conventional geometric patterns are used for the projection or projections 20p. In any event, the ratio of the total surface area (in plan view) of the projection(s) 20p of the anode 20 in contact with layer 14 compared to the total area of main body portion of the anode 20 (also in plan view) should fall in the range of 0.25 to 0.0025 or even possibly less. The contact area on the sidewalls is a secondary factor in terms of device performance, because most of the leakage current flows vertically thru the bottom faces.

Figure 5A:
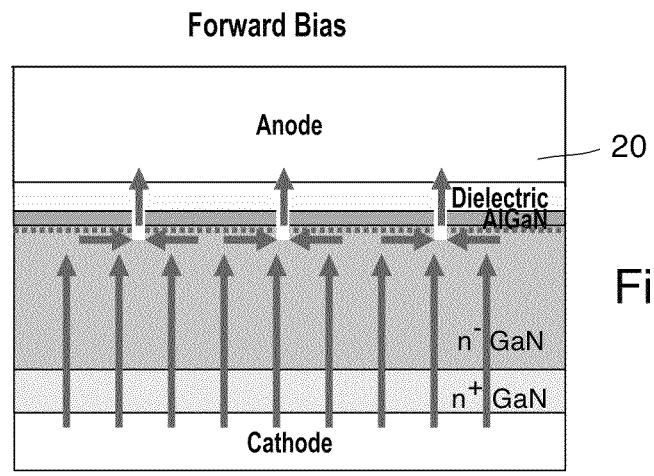
FIGS. 5a and 5b depict the device of FIG. 2 under forward bias (FIG. 5a) and reverse bias (FIG. 5b) conditions.
Figure 5B:
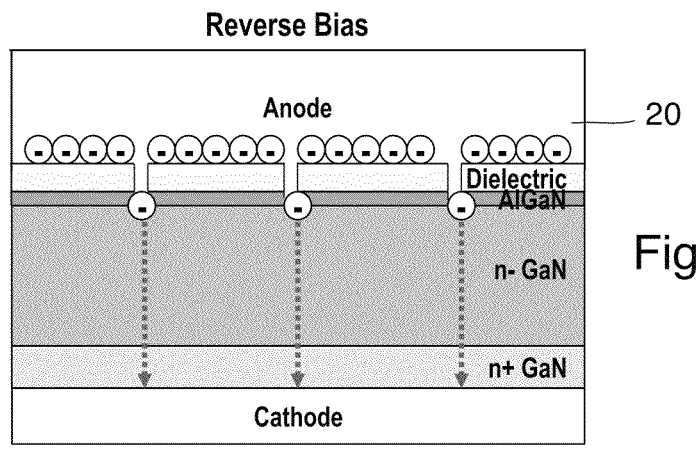

FIGS. 5a and 5b depict the device of FIG. 2 under forward bias (FIG. 5a) and reverse bias (FIG. 5b) conditions. When forward biased, the current flow from the cathode (as depicted by the lower vertical arrows) is expected to move laterally as needed (as depicted by the horizontal arrows) when coming into contact with the 2DEG conduction channel 24 and then move (as depicted by the upper vertical arrows) into the anode 20 via the one or more anode projections 20p. When reverse biased, electrons in layer 14 and 2DEG conduction channel 24 are depleted by the anode 20, through the dielectric layer 18, as well as the aperture region 22. Leakage current can only pass through the metal-semiconductor contact in region 22. This design enables lower leakage current because the reduced area of metal-semiconductor contact region, as compared with conventions diode depicted in FIG. 1.

Figure 6:
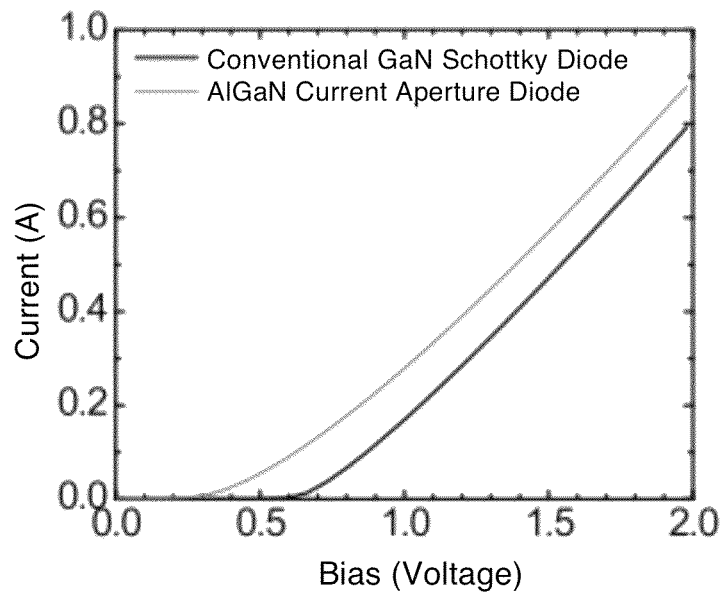
FIG. 6 is a graph of the forward voltage drop versus current for the current preferred device (with its measured voltage drop shown by a light grey line) compared to the forward voltage drop versus current of a conventional GaN Schottky diode (with its measured voltage drop shown by a dark line).

The current aperture diode disclosed herein (using AlGaN for layer 16) has a reduced forward voltage drop compared to a conventional GaN diode as noted by the graph of FIG. 6. FIG. 6 is a graph of the forward voltage drop versus current for the current preferred device (with its measured voltage drop shown by a light grey line) compared to the forward voltage drop versus current of a conventional GaN Schottky diode (with its measured voltage drop shown by a dark line).

The disclosed diode may be made as follows. The starting material is preferably a substrate of highly doped n-type GaN material with a doping concentration higher than $1E19\ cm^{-3}$ which will define layer 12 after it is thinned in a later step. The cathode 10 is preferably added to the thinned substrate 12 later, as is discussed below.

A layer 14 of lightly doped n-type GaN with the doping concentration preferably around $1E16\ cm^{-3}$ is grown on the highly doped n-type GaN substrate (preferably by metal-organic chemical vapor deposition (MOCVD)), as the drift layer 14. The thickness of the lightly doped GaN layer 14 is typically between 1 µm and 10 µm thick. Next a layer 16 of unintentionally doped III-nitride semiconductor layer is grown on the drift layer 14 (preferably by MOCVD) to serve as an electron supply layer. The electron supply layer 16 has a bandgap greater than that of the drift layer 14. The 2DEG conduction channel 24 forms at the interface between the electron supply layer 16 and the drift layer 14 due to the polarization effect. Electron supply layer layer 16 is preferably about 10 nm thick. Also, the preferred amount of Al in layer 16 of AlGaN is about 25%.

A layer of insulating dielectric 18 is formed on the electron supply layer 16. The insulating dielectric 18 can be, for example, SiN, AlN, $SiO_2$, $Al_2O_3$, or some combination thereof and can be formed, for example, by sputtering and/or by MBD (molecular beam deposition) and/or by CVD (chemical vapor deposition). The insulating dielectric 18 is, however, preferably grown to a thickness of about 10-20 nm by CVD. The dielectric layer 18 has to be sufficiently thin so that metal anode 20 to be formed on top of the dielectric layer 18 can effectively shape the electric-field in the device. One or more openings or trenches 22 is/are formed through the insulating dielectric 18 and the electron supply layer 16, stopping adjacent to or preferably within the drift layer 14. The width of the trench is preferably about 0.5 µm or less. The openings/trenches 22 are preferably patterned by photolithography techniques and preferably formed by plasma etching.

An anode 20 is formed on the exposed dielectric surface preferably by means of CVD or by electro-plating to thereby dispose a metal or metals (e.g. Ti, Al, Ni, Au) covering the dielectric layer 18 and filling the one or more openings or trenches 22 with anode material to form anode projection(s) 20*p*. Then the starting GaN substrate is preferably thinned down to around 100 µm from its backside, preferably by grinding and/or polishing (including possibly chemical metal polishing), to define the thickness of layer 12. The cathode 10 is formed on the backside of thinned GaN layer 12 preferably by chemical vapor deposition and/or electro-plating a metal or metals (e.g. Ti, Al, Ni, Au). Layer 12 provides a low-resistance contact with cathode 10 and provides mechanical support to the device.

The order of these steps may certainly be modified if desired. For example, the cathode could certainly be formed earlier in the described method than described above.

This concludes the description of preferred embodiments of the present invention. The foregoing description of one or more embodiments of the invention has been presented for the purposes of illustration and description. It is not intended to be exhaustive or to limit the invention to the precise form disclosed. Many modifications and variations are possible in light of the above teaching and will likely suggest themselves to those skilled in the art. It is intended that the scope of the invention be limited not by this detailed description, but rather by the claims appended hereto.

What is claimed is:

1. A diode comprising:
   a cathode;
   an anode;
   a plurality of semiconductor layers disposed between said cathode and said anode, said plurality of semiconductor layers forming a heterointerface between two of said plurality of semiconductor layers, and wherein said two semiconductor layers are formed of different materials, one material of said two semiconductor layers having a higher bandgap than a material of the other of said two semiconductor layers, with the semiconductor layer formed of the higher bandgap material being disposed (i) closer to a main portion of said anode and (ii) further from said cathode than the semiconductor layer formed of said other material; and
   a dielectric layer disposed between the semiconductor layer having the higher bandgap material and the main portion of said anode, the dielectric layer having one or more openings or trenches formed therein through which said anode projects into said at least said semiconductor layer having the higher bandgap material.

2. The diode of claim 1 wherein the anode projects through said one or more openings or trenches formed in said dielectric layer and extends through said semiconductor layer having the higher bandgap material and partially into the semiconductor layer having the other material.

3. The diode of claim 2 wherein a ratio of a total surface area when viewed in a plan view of the one or more openings or trenches formed in the dielectric layer to a total surface area of the dielectric layer is no greater than 0.25.

4. The diode of claim 3 wherein the semiconductor layer formed of said other material is formed of GaN and wherein the semiconductor material layer of said higher bandgap material is formed of AlGaN or AlInN.

5. The diode of claim 4 wherein the anode projects into said at least said semiconductor layer having the higher bandgap by means of one or more projections which extend from the main portion of the anode and into said at least the semiconductor layer having the higher bandgap material, the one or more projections having a wall width equal to or less than 0.5 µm.

6. The diode of claim 5 wherein said one or more projections extend through the semiconductor layer having the higher bandgap material and into the semiconductor layer having the other material.

7. The diode of claim 6 wherein the one or more projections extend into the semiconductor layer having the other material by a distance of about 10 nm.

8. The diode of claim 1 wherein the anode projects into said at least said semiconductor layer having the higher bandgap by means of plurality of said projections arranged in a regular geometric pattern.

9. The diode of claim 1 wherein the anode projects into said at least said semiconductor layer having the higher bandgap by means of a single, unitary projection formed in a repeating regular geometric pattern.

10. A diode comprising:
    a cathode;
    an anode;
    a plurality of semiconductor layers disposed between said cathode and said anode, said plurality of semiconductor layers forming a heterointerface between two of said plurality of semiconductor layers, and wherein said two semiconductor layers are formed of different materials, one material of said two semiconductor layers having a higher bandgap than a material of the other of said two semiconductor layers, with the semiconductor layer formed of the higher bandgap material being disposed closer to a main portion of said anode than the semiconductor layer formed of said other material; and a dielectric layer disposed between the semiconductor layer having the higher bandgap material and said anode, the dielectric layer having one or more openings or trenches formed therein through which said anode projects into said at least said semiconductor layer having the higher bandgap material and wherein the semiconductor layer formed of said other material is formed of a layer of n– GaN material and wherein said plurality of semiconductors layers further includes a layer of n+ GaN material disposed between said layer of n– GaN material and said cathode.

11. A diode comprising:
an anode;
a cathode;
a dielectric layer disposed adjacent the anode, the anode having one or more projections which penetrate the dielectric layer and which point towards, but do not contact, the cathode;
a drift layer and an electron supply layer disposed between the cathode and the dielectric layer, the one or more projections of the anode contacting both the drift layer and the electron supply layer;
a two-dimensional electron gas conduction channel defined between the drift layer and the electron supply layer, the one or more projections of the anode which penetrate the dielectric layer also being in contact with the two-dimensional electron gas conduction channel.

12. The diode of claim 11 wherein the electron supply layer has a higher bandgap than the drift layer for defining a heterojunction at an interface of the electron supply layer and the drift layer, the two-dimensional electron gas conduction channel occurring at said heterojunction and wherein the one or more projections comprise a plurality of projections which penetrate the two-dimensional electron gas conduction channel occurring at said heterojunction.

13. A diode comprising:
two semiconductor layers disposed on a third semiconductor material, the two semiconductor layers being formed of different materials, a first material of said two semiconductor layers having a relatively lower bandgap and a second material of said two semiconductor layers having a relatively higher bandgap, the semiconductor layer of said first material being disposed directly on said third semiconductor material and the semiconductor layer of said second material being disposed directly on the semiconductor layer of said first material;
a dielectric layer disposed on the semiconductor layer of said second material, said dielectric layer having one or more openings or trenches penetrating the dielectric layer;
an anode disposed on said dielectric layer and in said one or more openings or trenches so that material of the anode is in physical contact with the semiconductor layer of said second material; and
a cathode disposed in contact with said third semiconductor material and spaced from said two semiconductor layers.

14. The diode of claim 13 wherein the one or more openings or trenches penetrating the dielectric material comprise a plurality of openings or trenches arranged in a regular geometric pattern.

15. A diode comprising:
two semiconductor layers disposed on a third semiconductor material, the two semiconductor layers being formed of different materials, a first material of said two semiconductor layers having a relatively lower bandgap and a second material of said two semiconductor layers having a relatively higher bandgap, the semiconductor layer of said first material being disposed directly on said third semiconductor material and the semiconductor layer of said second material being disposed directly on the semiconductor layer of said first material;
a dielectric layer disposed on the semiconductor layer of said second material, said dielectric layer having one or more openings or trenches penetrating the dielectric layer;
an anode disposed on said dielectric layer and in said one or more openings or trenches so that material of the anode at least contacts the semiconductor layer of said second material;
a cathode disposed in contact with said third semiconductor material and spaced from said two semiconductor layers; and
wherein said one or more openings or trenches also penetrate the semiconductor layer of said second material and partially enter the semiconductor layer of said first material.

16. The diode of claim 15 wherein a ratio of a total surface area when viewed in a plan view of the one or more openings or trenches formed in the dielectric layer to a total surface area of the dielectric layer is no greater than 0.25.

17. The diode of claim 16 wherein the semiconductor layer formed of said first material is GaN and wherein the semiconductor material layer of said second material is AlGaN or AlInN.

18. The diode of claim 17 wherein the third semiconductor material is n+ GaN material and semiconductor layer of said first material is a layer of n– GaN material.

19. The diode of claim 17 wherein the anode projects into said at least said semiconductor layer having the second material by means of one or more projections which extend from the anode and into said at least the semiconductor layer having the second material, the one or more projections having a wall width equal to or less than 0.5 µm.

20. The diode of claim 19 wherein said one or more projections extend through the semiconductor layer of the second material and into the semiconductor layer of the first material by a distance equal to or less than the wall width of one of said one or more projections.

21. The diode of claim 20 wherein the one or more projections extend into the semiconductor layer of the first material by a distance of about 10 nm.

22. The diode of claim 15 wherein the one or more openings or trenches penetrating the dielectric material comprises a plurality of openings or trenches penetrating the dielectric material.

23. The diode of claim 22 wherein the plurality of openings or trenches defines a repeating regular geometric pattern of said openings or trenches.

24. The diode of claim 23 wherein the repeating regular geometric pattern has a hexagonal shape.

25. The diode of claim 15 wherein the material of the anode is at least in physical contact with the semiconductor layer of said second material.

26. A diode comprising:
an anode;
a cathode;

a dielectric layer disposed between the anode and the cathode, the anode having a plurality of projections which penetrate a plurality of openings formed in the dielectric layer;

a two-dimensional electron gas conduction channel located at a heterojunction formed between said cathode and said dielectric layer, the plurality of projections of the anode contacting said two-dimensional electron gas conduction channel.

27. The diode of claim 26 wherein the heterojunction includes a drift layer and an electron supply layer disposed between the cathode and the dielectric layer, the heterojunction being formed at an interface between the drift layer and the electron supply layer.

28. The diode of claim 27 wherein the electron supply layer has a higher bandgap than the drift layer for defining said heterojunction at the interface of the electron supply layer and the drift layer, the two-dimensional electron gas conduction channel occurring at said heterojunction.

29. The diode of claim 26 wherein two-dimensional electron gas conduction channel supports current flow when said diode is, in use, forward biased, said current flow flowing from said cathode towards said two-dimensional electron gas conduction channel and then laterally at said two-dimensional electron gas conduction channel to a closest one of the plurality of projections of said anode.

* * * * *